(12) United States Patent
Jia et al.

(10) Patent No.: US 10,797,618 B2
(45) Date of Patent: Oct. 6, 2020

(54) VIBRATION-BASED ENERGY HARVESTER WITH STRAIN OPTIMISED TOPOLOGY

(71) Applicant: Cambridge Enterprise Limited, Cambridge (GB)

(72) Inventors: Yu Jia, Cambridge (GB); Ashwin Arunkumar Seshia, Cambridge (GB); Sijun Du, Cambridge (GB)

(73) Assignee: Cambridge Enterprise Limited, Cambridge (GB)

(*) Notice: Subject to any disclaimer, the term of this patent is extended or adjusted under 35 U.S.C. 154(b) by 425 days.

(21) Appl. No.: 15/744,344

(22) PCT Filed: Jul. 15, 2016

(86) PCT No.: PCT/GB2016/052152
§ 371 (c)(1),
(2) Date: Jan. 12, 2018

(87) PCT Pub. No.: WO2017/009660
PCT Pub. Date: Jan. 19, 2017

(65) Prior Publication Data
US 2018/0198384 A1    Jul. 12, 2018

(30) Foreign Application Priority Data

Jul. 16, 2015    (GB) .................................. 1512456.3

(51) Int. Cl.
*H01L 41/113*    (2006.01)
*H02N 2/18*    (2006.01)
(Continued)

(52) U.S. Cl.
CPC ........... *H02N 2/188* (2013.01); *H01L 41/081* (2013.01); *H01L 41/1136* (2013.01); *H01L 41/1138* (2013.01); *H01L 41/0478* (2013.01)

(58) Field of Classification Search
CPC ... H02N 2/188; H01L 41/081; H01L 41/1136; H01L 41/1138; H01L 41/0478
(Continued)

(56) References Cited

U.S. PATENT DOCUMENTS 4,658,175 A * 4/1987 Albert .................... G01L 1/162
310/323.21
6,984,902 B1    1/2006 Huang et al.
(Continued)

FOREIGN PATENT DOCUMENTS

DE    10 2013 204 101 A1    9/2014
EP           2610935 A1    7/2013
(Continued)

OTHER PUBLICATIONS

Kaveckaite, Ausra; PCT/GB2016/052152; International Search Report and Written Opinion; International Searching Authority—EPO; dated Nov. 17, 2016.
(Continued)

*Primary Examiner* — Thomas M Dougherty
(74) *Attorney, Agent, or Firm* — Nexsen Pruet LLC; Todd A. Serbin (57) ABSTRACT

An apparatus is provided for harvesting energy from mechanical vibrations with an improved power output. The apparatus comprises a frame (22), a first member (20) comprising a piezoelectric material, a cantilever beam (26) and an electrode. The first member is fixed to the frame at a first position and a second position and extends between the first and second positions. The cantilever beam has a first end fixed to the first member between the first position and the second position and a second end fixed to a proof mass (24). The electrode is fixed to the first member at a position between the first position and the second position. In another aspect, the apparatus may comprise a plurality of proof
(Continued)

masses connected to the first member between the first and second positions in a spaced relationship to one another.

32 Claims, 9 Drawing Sheets

(51) Int. Cl.
  *H01L 41/08* (2006.01)
  *H01L 41/047* (2006.01)
(58) Field of Classification Search
  USPC .......................................................... 310/339
  See application file for complete search history.

(56) References Cited

U.S. PATENT DOCUMENTS

| | | | |
|---|---|---|---|
| 7,635,941 B2 * | 12/2009 | Bank | H04R 7/18 |
| | | | 310/328 |
| 8,080,920 B2 | 12/2011 | Andosca et al. | |
| 8,193,684 B2 | 6/2012 | Martin | |
| 8,354,778 B2 | 1/2013 | Arnold et al. | |
| 2005/0280334 A1 * | 12/2005 | Ott | H01L 41/1136 |
| | | | 310/339 |
| 2008/0092354 A1 * | 4/2008 | Clingman | H01L 41/25 |
| | | | 29/25.35 |
| 2010/0013357 A1 | 1/2010 | Hirasawa | |
| 2013/0207520 A1 * | 8/2013 | Near | H02N 2/186 |
| | | | 310/339 |
| 2020/0076331 A1 * | 3/2020 | Song | H01L 41/053 |

FOREIGN PATENT DOCUMENTS

| | | | |
|---|---|---|---|
| JP | 2008 197140 | A | 8/2008 |
| JP | 2008197140 | A | 8/2008 |
| WO | 2010/128864 | A1 | 11/2010 |
| WO | 2013/175449 | A2 | 11/2013 |
| WO | 2015036869 | A2 | 3/2015 |

OTHER PUBLICATIONS

Fellows, Mr. Jody; UKIPO Search Report; GB1512456.3; dated Jan. 15, 2016.
Fellows, Mr. Jody; UKIPO Search Report; GB1512456.3; dated Jun. 23, 2016.
Aktakka, Ethem Erkan; et al., "Thinned-PZT on SOI Process and Design Optimization for Piezoelectric Inertial Energy Harvesting", Center for Wireless Integrated Microsystems (WIMS), IEEE, Jun. 5-9, 2011; pp. 1649-1652, Beijing, China.
Andosca, Robert; et al.; "Experimental and Theoretical Studies on MEMS Piezoelectric Vibrational Energy Harvesters with Mass Loading"; Sensors and Actuators A: Physical; Elsevier; 2010; pp. 76-87, vol. 178.
Suzuki, Yuji; et al.; "A MEMS Electret Generator with Electrostatic Levitation for Vibration-Driven Energy-Harvesting Applications"; Journal of Micromechanics and Microengineering; IOP Publishing Ltd., 2012; 8 Pages.
Nickitas-Etienne, Athina; PCT/GB2016/052152; International Preliminary Report on Patentability; International Bureau; 8 pages; dated Jan. 25, 2018.
Chen, Xu-Rui et al.; "Vibration Energy Harvesting with a Clamped Piezoelectric Circular Diaphragm"; Ceramics International; Elsevier; May 5, 2011; pp. S271-S274.
Erturk, Alper et al.; "Modeling of Piezoelectric Energy Harvesting from an L-shaped Beam-mass Structure with an Application to UAVs"; Journal of Intelligent Material Systems and Structures; Nov. 20, 2008; pp. 1-16; vol. 00.
Roundy, Shad et al.; "Improving Power Output for Vibration-Based Energy Scavengers"; Pervasive Computing; IEEE; Jan.-Mar. 2005; pp. 28-36.
Su, Wei-Jiun et al.; "Modeling of V-Shaped Beam-mass Piezoelectric Energy Harvester: Impact of the Angle Between the Beams"; ASME; 2012; pp. 1-7.
Wang, Wei et al.; "Vibration Energy Harvesting Using a Piezolectric Circular Diaphragm Array"; IEEE; Sep. 2012; pp. 2022-2026; vol. 59; No. 9.
Liu, Huicong et al.; "A Multi-frequency Vibration-based MEMS Electromagnetic Energy Harvesting Device", Sensors and Actuators; Elsevier; 2013; pp. 37-43.

* cited by examiner

FIG. 1

PRIOR ART

VIBRATION-BASED ENERGY HARVESTER WITH STRAIN OPTIMISED TOPOLOGY

FIELD OF THE INVENTION

The invention relates to vibration-based energy harvesters and in particular to MEMS energy harvesting devices using piezoelectric material.

BACKGROUND TO THE INVENTION

Vibration-based energy harvesters are used to extract energy from mechanical vibrations in order to power local devices or in order to store that energy for later use. Piezoelectric materials are widely used in vibration-based energy harvesters. Piezoelectric materials convert mechanical strain energy into electrical energy and so are ideally suited for this purpose.

A typical MEMS piezoelectric energy harvester comprises a cantilever beam including a piezoelectric layer or portion. The cantilever beam is fixed at one end to a vibrating support structure. A proof mass is suspended from the other, free end of the cantilever beam. Electrodes are provided on the piezoelectric material in areas where high strain energy is expected, between the ends of the beam. As the support structure vibrates, the cantilever beam vibrates and mechanical strain is generated with the piezoelectric material. This is converted to an electrical potential difference between the electrodes. The electrodes are coupled to a power management circuit to extract the electrical energy.

This design has the benefit of being simple and compact and has a high power output at its resonant frequency. However, away from the resonant frequency the power output drops significantly. The natural or ambient vibrations available for driving an energy harvester tend to contain a wide band of vibration frequencies and to vary with time. It would therefore be desirable to provide a vibration-based energy harvester that has a significant power output over a wider band of vibration frequencies.

It would also be desirable to provide a vibration-based energy harvester with a topology that is more robust than a simple cantilever beam.

One alternative to a single cantilever beam topology is a clamped-clamped beam topology, in which the vibrating beam or membrane is clamped to the support structure in more than one position. This topology has the advantage of increased robustness and a broader frequency band response. However, a drawback of this topology is that the proof mass is typically placed in a central position of the beam or membrane where the strain energy would be greatest. The proof mass causes stiffening of the beam or membrane local to the proof mass and so reduces the strain energy in the region of the proof mass.

It would be desirable to provide an energy harvester with the benefits of a clamped-clamped type beam topology but with an improved power output.

SUMMARY OF THE INVENTION

The invention is defined in the appended claims, to which reference should now be made. Preferred features are set out in the dependent claims.

In a first aspect, there is provided an energy harvesting apparatus comprising:

a frame;
a first member comprising a piezoelectric material, the first member fixed to the frame at a first position and at a second position, and extending between the first and second positions;
a cantilever beam having a first end fixed to the first member between the first position and the second position and having a second end fixed to a proof mass; and
an electrode fixed to the first member at a position between the first position and the second position.

This arrangement allows for the benefits of a clamped-clamped beam topology, which are a broad bandwidth of frequencies that provide for significant power output and robustness, with the higher peak power output associated with cantilever beam topologies. This is because the proof mass is held away from the areas of maximum strain energy.

An energy harvesting apparatus may further comprise electric circuitry connected to the electrode. The electric circuitry may comprise a power conditioning circuit. The electric circuitry may comprise or be connected to an energy storage device. This allows for energy harvested from the apparatus to be stored for later use.

The first member may be a beam having one end fixed to the frame at the first position and an opposite end of the beam fixed to the frame at the second position. Alternatively, the first member may be a membrane vibrator. The membrane vibrator may be fixed to the frame at a plurality of positions around an outer edge of the membrane vibrator.

The cantilever beam may be co-planar with the first member. The first member may be configured to vibrate in a first direction. The cantilever beam and the first member may extend in a plane orthogonal to the first direction. The cantilever beam may extend generally parallel to a line extending between the first position and the second position.

The cantilever beam may be fixed to the first member at a position substantially equidistant between the first position and the second position. This generally provides for the greatest power output for a given input vibration when the cantilever beam has a resonant frequency similar or equal to the resonant frequency of the first member.

The cantilever beam may comprise a piezoelectric material. An electrode may then be fixed to the cantilever beam in order to extract more energy from the apparatus.

The apparatus may further comprise a plurality of electrodes fixed to the first member. There may be regions on the first member having an opposite strain to one another. Separate electrodes can be placed on those regions in order to extract more energy from the apparatus.

The apparatus may comprise a plurality of cantilever beams fixed to the first member between the first position and the second position, each cantilever beam fixed to or comprising a proof mass. Plural cantilever beams may offer a better power output for a given size of apparatus and may provide for different modes of vibration and so a broader frequency response.

The apparatus may comprise a second member comprising a piezoelectric material, the second member fixed to the frame at a third position and at a fourth position, and extending between the third and fourth positions, and the cantilever beam may be connected to the second member between third and fourth positions.

The apparatus may comprise a plurality of members comprising a piezoelectric material and fixed to the frame at opposing ends and cantilever beams connected between the members at positions between the opposing ends. Multiple clamped members and cantilever beams may allow for a more even strain distribution across the piezoelectric material allowing for more efficient energy extraction.

Advantageously the first member comprises a substrate layer, wherein the piezoelectric material forms an active layer on the substrate layer. The substrate layer may advantageously be formed from silicon. The frame may also be formed from silicon. The piezoelectric material may be aluminium nitride. The thickness of the active layer relative to the thickness of the substrate layer may be chosen to maximise power output.

The second member and any further members may also comprises a substrate layer, wherein the piezoelectric material forms an active layer on the substrate layer. The substrate layer may advantageously be formed from silicon. The frame may also be formed from silicon. The piezoelectric material may be aluminium nitride.

The cantilever beam, or cantilever beams, may comprise a silicon substrate layer. The substrate layers of frame, first member and cantilever beam may all be formed from a single piece of silicon.

The first member has a length between the first position and the second position, a width in a direction orthogonal to the length and a thickness in a direction orthogonal to the length and the width. The thickness may extend in the direction of vibration of the first member. A top surface of the substrate layer may extend in the length and width directions, and the active layer may be placed on the top surface. Advantageously the width of the first member is at least an order of magnitude greater than the thickness of the active layer. A width of the cantilever beam is also advantageously at least an order of magnitude greater than the thickness of the active layer.

A length or width of a connecting portion between the first member and the cantilever beam may be chosen to provide for a desired strain distribution across the apparatus. A wider connecting portion leads to a more even strain distribution but a lower peak strain for a given input vibration.

The apparatus may comprise a reinforcing beam positioned to extend between the first member and the cantilever beam at a position at which the cantilever beam is fixed to the first member. The reinforcing beam may take the form of a thin beam. The reinforcing beam acts to reinforce the connection between the first member and the cantilever beam. This allows the connection between the cantilever beam and the first member to be made thin but at the same time reliable and unlikely to break even when highly excited. The reinforcing beam may extend between a first member and second member, across one or more cantilever beams connected between the first and second members.

The apparatus may comprise a plurality of proof masses fixed to the cantilever beam or to the first member, wherein the plurality of proof masses are spaced apart from one another. In particular, a plurality of spaced apart proof masses may be fixed to the first member, wherein a central portion of the first member, equidistant from the first position and the second position, is not fixed to a proof mass. The central portion is the portion of maximum strain energy and maximum displacement of the first member during vibration of the first member. The electrode may be fixed to the central portion.

In a second aspect of the invention, there is provided an energy harvesting apparatus comprising:
a frame;
a first member comprising a piezoelectric material, the first member fixed to the frame at a first position and at a second position, and extending between the first and second positions;
a plurality of proof masses connected to the first member between the first and second positions in a spaced relationship to one another; and
an electrode fixed to the first member.

The plurality of proof masses are in a spaced relationship to one another so that an area of the first member extends between each pair of proof masses. This area, or areas, can flex to provide regions of high strain.

The electrode may be positioned on an area of the first member corresponding to a space between the plurality of proof masses.

Advantageously, a central area of the first member, equidistant from the first position and the second position, is not connected to a proof mass. Allowing a central area of the first member to be free of proof mass allows the first member to flex in the central area to provide a high strain area from which energy can be recovered. Allowing a central area of the first member to flex also allows a greater number of vibratory modes to be established. The plurality of proof masses may be symmetrically disposed on the first member. The first member may be a membrane vibrator.

The plurality of proof masses may be considered to be a single segmented proof mass. An apparatus in accordance with the second aspect of the invention retains the benefit of being robust found with clamped-clamped vibrator structures and allows for a significant proof mass to be used but allows for energy to be extracted from regions of high strain on the first member. Furthermore, an apparatus in accordance with the second aspect of the invention may be used as a parametric resonator.

In another aspect of the invention, there is provided an energy harvesting apparatus comprising:
a frame;
a first member comprising a piezoelectric material, the first member fixed to the frame at a first position and at a second position, and extending between the first and second positions, the first member configured to vibrate in a first direction;
a proof mass, wherein the proof mass is coupled to the first member but positioned away from a central region of the first member, the central region of the first member comprising a point of maximum displacement of the first member in the first direction during vibration of the first member; and
an electrode fixed to and covering the central region of the first member.

The central region may be equidistant between the first position and the second position. The apparatus may comprise a cantilever beam having a first end fixed to the first member between the first position and the second position and having a second end fixed to the proof mass. The cantilever beam and the first member are advantageously coplanar and lie in a plane orthogonal to the first direction.

The apparatus may comprise a plurality of proof masses connected to the first member between the first and second positions, the plurality of proof masses being in a spaced relationship to one another, wherein none of the plurality of proof masses are fixed to the central region of the first member.

In all aspects of the invention, the proof mass is held away from the region of maximum potential strain energy of the first member. This allows for a greater amount of energy to be harvested from the device.

It should be clear that features of first aspect of the invention may be equally be applied to the second aspect of the invention and vice versa.

BRIEF DESCRIPTION OF THE DRAWINGS

Embodiments of the invention will now be described, by way of example only, with reference to the accompanying drawings, in which.

DETAILED DESCRIPTION

Figure 1:
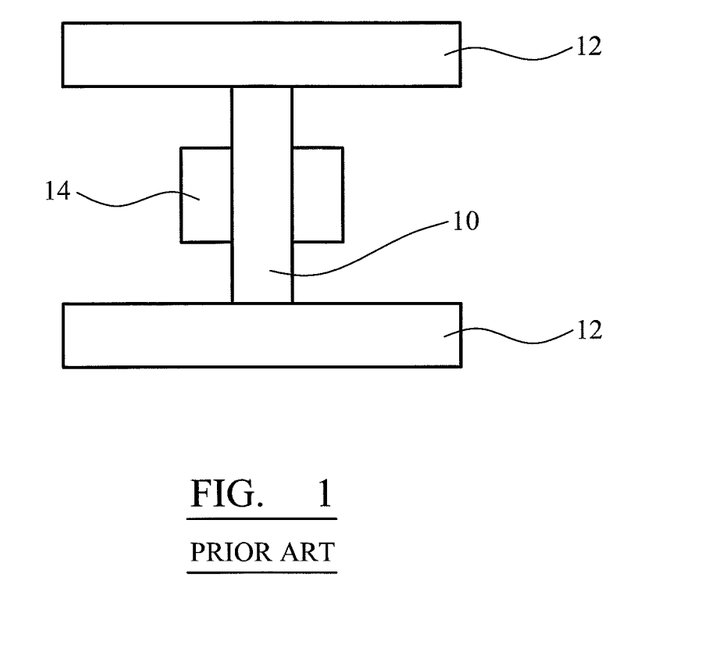
FIG. 1 is a schematic view of a clamped-clamped beam in accordance with the prior art.

FIG. 1 is a schematic view of a clamped-clamped beam in accordance with the prior art. A vibrating member 10 is fixed at opposite ends to a frame 12. A proof mass 14 is fixed to the vibrating member at a position between the two ends. The vibrating member has at least one active layer formed from a piezoelectric material and an electrode fixed to the active layer. As the vibrating member vibrates, the active layer experiences time varying strain and this strain is converted into a time varying electrical potential at the electrode. The electric potential generated by the active layer is proportional to the average strain experienced by the active layer.

A proof mass is required in order to generate any significant strain. However, a drawback of the arrangement illustrated in FIG. 1 is that the proof mass causes stiffening of the vibrating member in the region of the proof mass and so reduces the strain experienced by the active layer in the region of the proof mass to almost zero.

Figure 2:
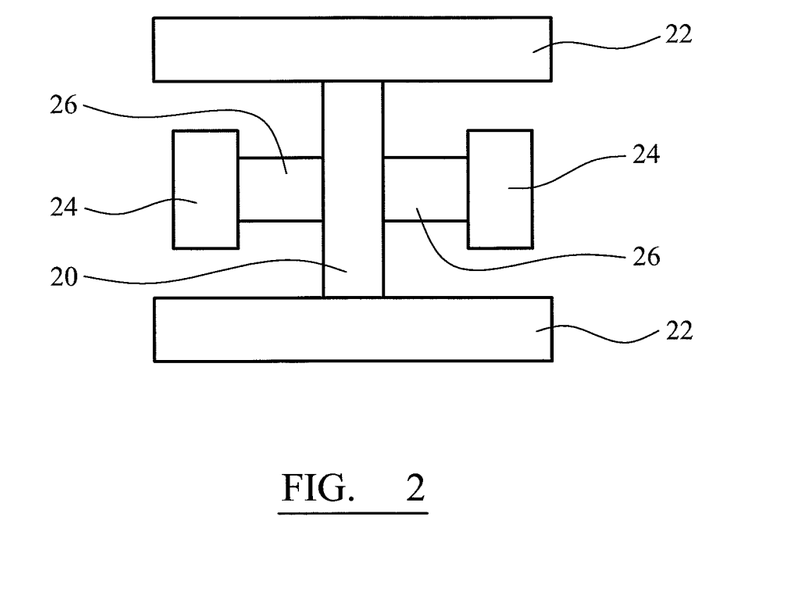
FIG. 2 is a schematic view of device in accordance with an embodiment of the invention.

FIG. 2 is a schematic view of a device topology in accordance with the invention. The device comprises a first member 20 fixed to a frame 22 at opposite ends. Two cantilever beams 26 extend from a central portion of the first member. A free end of each cantilever beam is fixed to a proof mass 24.

With the topology shown in FIG. 2 the absence of a proof mass at the centre of the first member means that significant strain can be generated at the centre of the first member, which allows for greater energy extraction from the device. At the same time, the benefits of a clamped-clamped beam topology over a simple cantilever topology, which are broader frequency response and greater robustness, are retained. In addition, an active layer and electrodes can be placed on the cantilever beams to extract energy from the strain generated as a result of the vibration of the cantilever beams.

Figure 3:
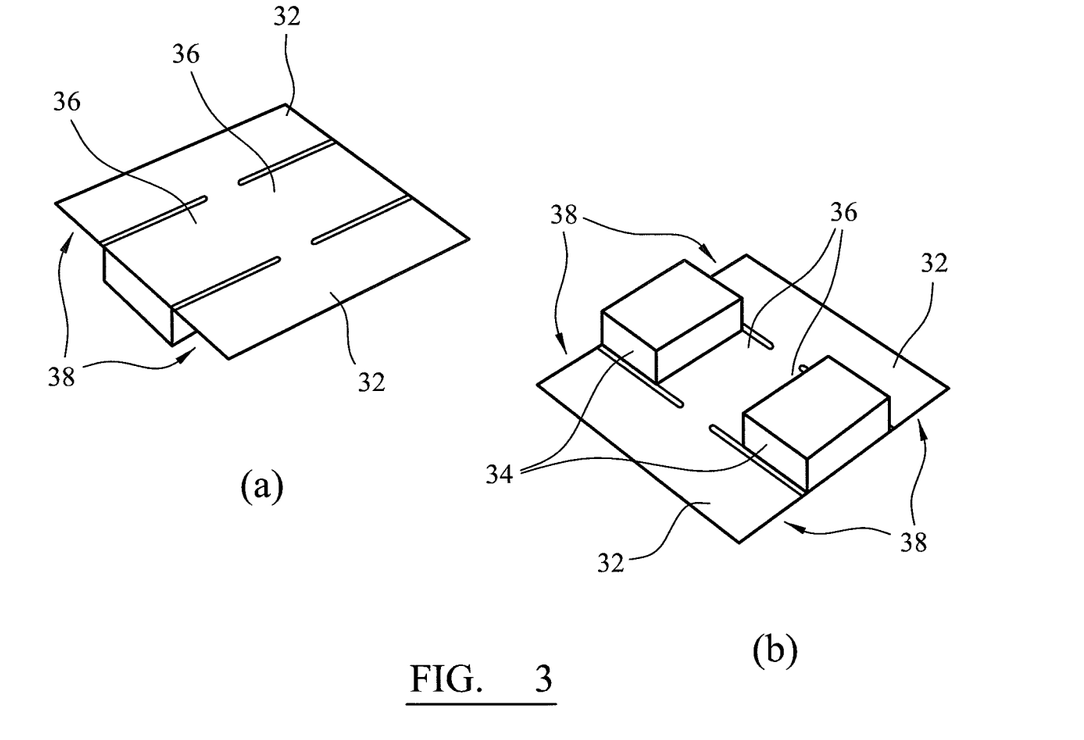
FIG. 3a is a top side perspective view of device in accordance with an embodiment of the invention.
FIG. 3b is an underside perspective view of device in accordance with an embodiment of the invention.

FIG. 3a is a top side perspective view of a device having a topology as shown in FIG. 2, with the frame removed for clarity. FIG. 3b is an underside perspective view of the device shown in FIG. 3a, with the frame removed for clarity. In the arrangement shown in FIGS. 3a and 3b there are two first members 32, each anchored at anchor points 38 at opposite ends to the frame (not shown). The cantilever beams 36 are connected to both first members 32 at a central region of each of the first members and extend parallel to the first members 32. The proof masses 34 are formed on the free ends of the cantilever beams.

There are several possibilities for the material structure of a device in accordance with the invention. FIG. 4a illustrates a first example of the material layers of the first member or first members and of the cantilever beam or beams. In this example the substrate layer 40 is formed from silicon. A further layer of silicon 41 is formed on the substrate layer 40 followed by a bottom electrode 42. The active layer of piezoelectric material 43, in this example aluminium nitride (AlN) is then placed on the bottom electrode 42 followed by a top electrode 44. The voltage between the top and bottom electrodes is used to extract electrical energy from the device.

FIG. 4b illustrates an alternative structure. In the example of FIG. 4b the substrate layer 40 is again formed from silicon. A layer of silicon oxide 45 is formed on the substrate layer 40 followed by a layer of doped silicon 46 effectively formed a bottom electrode. The active layer of piezoelectric material 43, in this example AlN is then placed on the doped silicon layer 46 followed by a top electrode 44. The voltage between the top electrode and the doped silicon layer is used to extract electrical energy from the device.

In the example shown in FIGS. 3a and 3b, the first members 32 have a length of 3500 µm and a width of 1000 µm. The cantilever beams have a width of 1400 µm. The proof masses are formed of silicon and each have a length of 1000 µm, a width of 1400 µm and a mass of 1.288 mg. The first members and cantilever beams are formed from a substrate layer of silicon of 10 µm thickness and have an active layer of aluminium nitride (AlN) of 0.5 µm thickness.

The substrate layer and the active layer have a greater thickness than the other layers. The relative thicknesses of the layers, and in particular the thickness of the active layer relative to the substrate layer, can be chosen to maximise the average strain experiences by the active layer.

Figure 5:
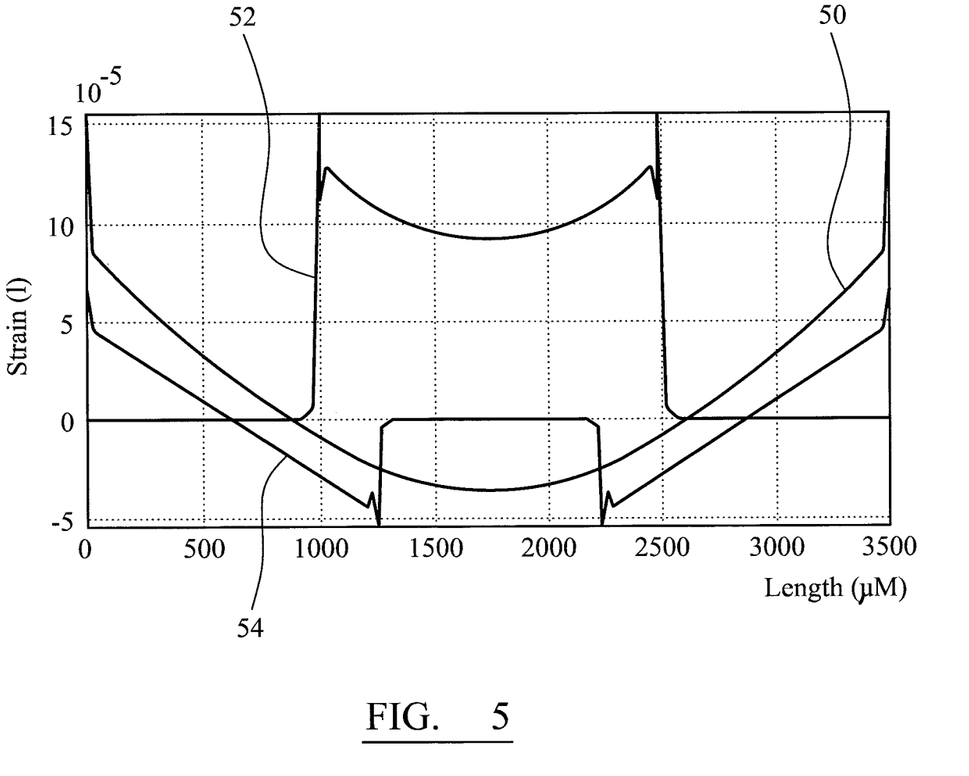
FIG. 5 is a plot of strain along the length of a device as shown in FIG. 1 and as shown in FIGS. 3a and 3b.

FIG. 5 is a plot of strain along the length of the first members and along the cantilever beams of the device shown in FIGS. 3a and 3b. Also shown is the strain along the length of a beam in a device of the type shown in FIG. 1 with a centrally located proof mass. Line 50 is the strain along a first member 32. It can be seen that there is significant strain in the central portion of the member and that the strain in the central portion of the member is of the opposite sign to the strain at the fixed ends. Line 52 is the strain along the length of the cantilever beams. It can be seen that there is zero strain in the vicinity of the proof masses, but that there is very significant strain at the fixed ends of the cantilever beams, close to the position at which they are connected to the first members. In contrast in a topology of the type shown in FIG. 1, there is zero strain in the central region where the proof mass is positioned, and the average strain along the beam is lower. Line 54 is the strain along a member 10 as shown in FIG. 1.

The maximum power extractable from an energy harvester of this type can be calculated. First, the average electric charge generated across the active layer can be calculated. The average electric charge generated across the active layer is:

$$q = d_{31} \varepsilon_{av} E a_{pz}$$

where q is the charge generated, $d_{31}$ is the piezoelectric charge constant in the 31 mode, $\varepsilon_{av}$ is the average strain experienced by the piezoelectric transducer, E is the elastic modulus of the piezoelectric material and $a_{pz}$ is the active piezoelectric area.

The power extractable across an ideal impedance can then be calculated:

$$P = \frac{\omega h_p q^2}{\varepsilon_o \varepsilon_r a_{pz}}$$

Where P is the peak power, $\omega$ is the frequency, $h_p$ is the thickness of the piezoelectric layer, $\varepsilon_0$ is the permittivity of free space, and $\varepsilon_r$ is the dielectric constant of the piezoelectric material.

Figure 6:
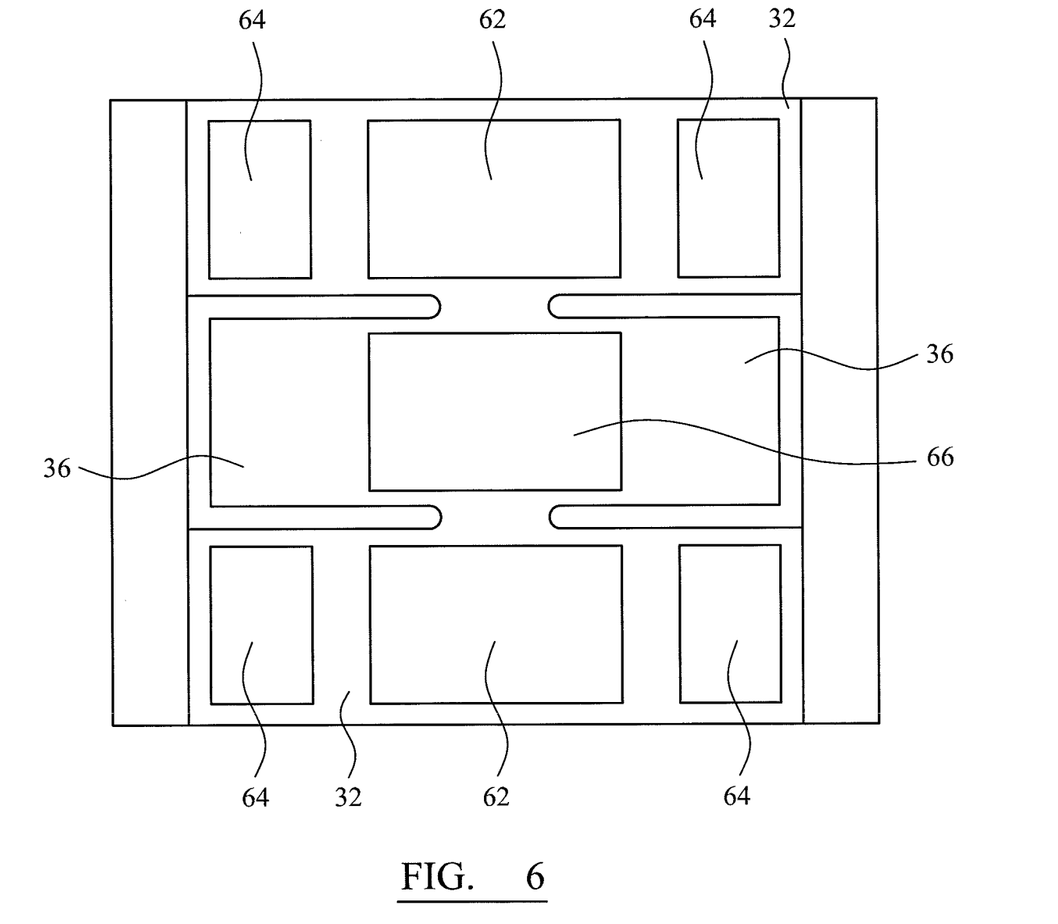
FIG. 6 is an illustration of the position of electrodes on a device of the type shown in FIG. 2.

In order to maximize power output, the active area over which charge is extracted should be maximised. To do this electrodes can be placed on different regions of the device. FIG. 6 illustrates the position of electrodes on the device shown in FIGS. 3a and 3b in view of the strain distribution illustrated in FIG. 4. It can be seen that there are three electrode regions 62, 64, 66. First electrodes 62 are placed over the centre of the first members. Second electrodes 64 are placed at either end of the first members. These electrodes are separate from the first electrodes because the strain at the ends of the first member is of the opposite sign to the strain at the centre of the first member. Accordingly, the voltage at the second electrodes will be of opposite polarity to the voltage at the first electrodes. A third electrode 66 is placed on the central portion of the cantilever beams. As there is no strain at the free ends of the cantilever beams no electrode is placed on those regions.

Figure 7:
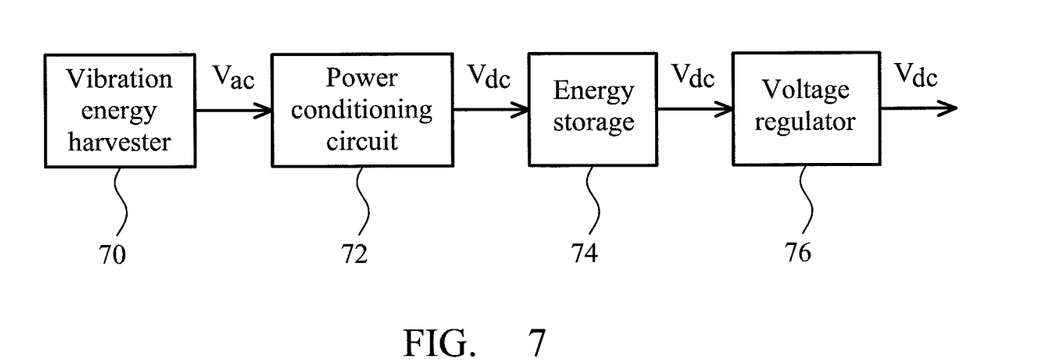
FIG. 7 is a schematic illustration of electrical circuitry in a device in accordance with the invention.

FIG. 7 is a schematic illustration of electrical circuitry that can be coupled to a device as shown in FIGS. 3a, 3b and 6, to provide useful power output. The electric circuitry comprises a power conditioning circuit 72 connected to the electrodes of the device 70, an energy storage device 74, such as capacitor or rechargeable battery, connected to the power conditioning circuit and a voltage regulator 76 connected to the energy storage device in order to provide a desired and stable voltage output. Each set of electrodes may be connected to a separate power conditioning circuit but the outputs of the power conditioning circuit may all be provided to the same energy storage device.

The geometry of a device as illustrated in FIGS. 3a and 3b may be altered in order to provide for different strain distributions, which may be beneficial for different environmental conditions.

Figure 8:
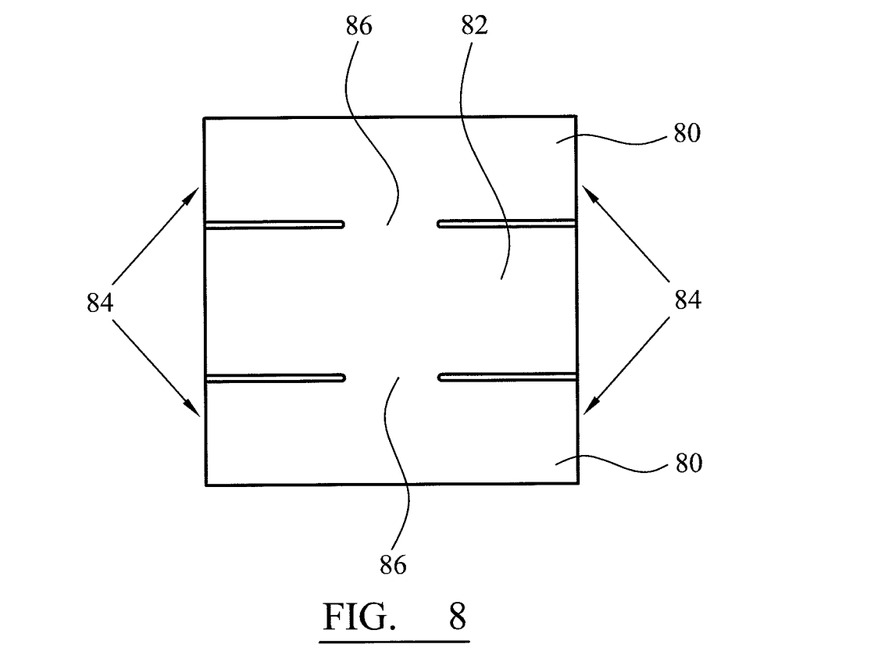
FIG. 8 is a plan view of an example of a device in accordance with the invention with wide connection between the clamped beams and the cantilever beams.

FIG. 8 illustrates a device of the type shown in FIGS. 3a and 3b but with a wider connection 86 between the first members 80 and the cantilever beams 82. The first members are fixed to a frame (not shown) at anchor points 84. This arrangement gives rise to lower peak strain but a more even strain distribution across the device.

Figure 9:
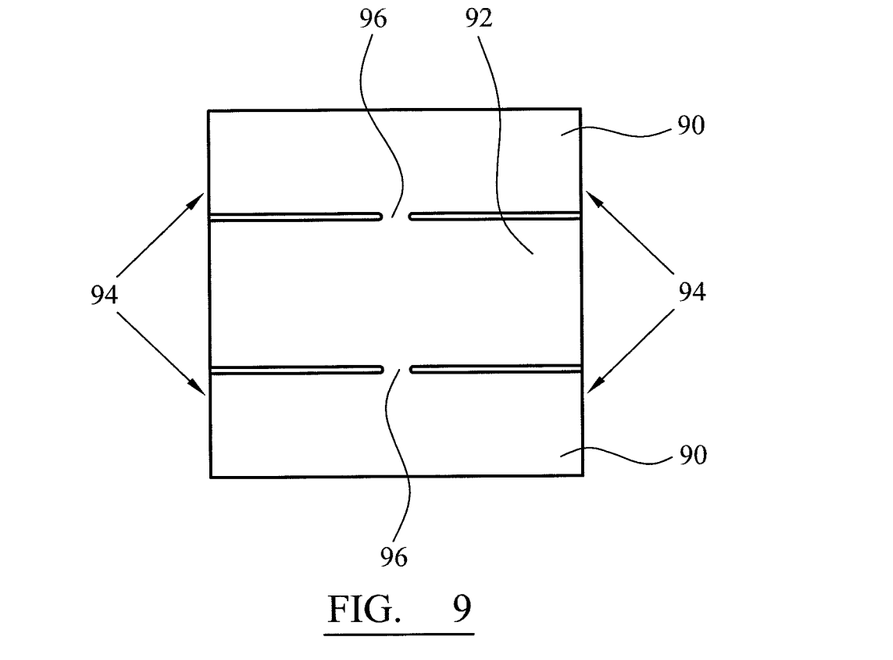
FIG. 9 is a plan view of an example of a device in accordance with the invention with narrow connection between the clamped beams and the cantilever beams.

FIG. 9 illustrates a device of the type shown in FIGS. 3a and 3b but with a thinner connection 96 between the first members 90 and the cantilever beams 92. The first members are fixed to a frame (not shown) at anchor points 94. This arrangement gives rise to higher peak strain but a more uneven strain distribution across the device.

Figure 10:
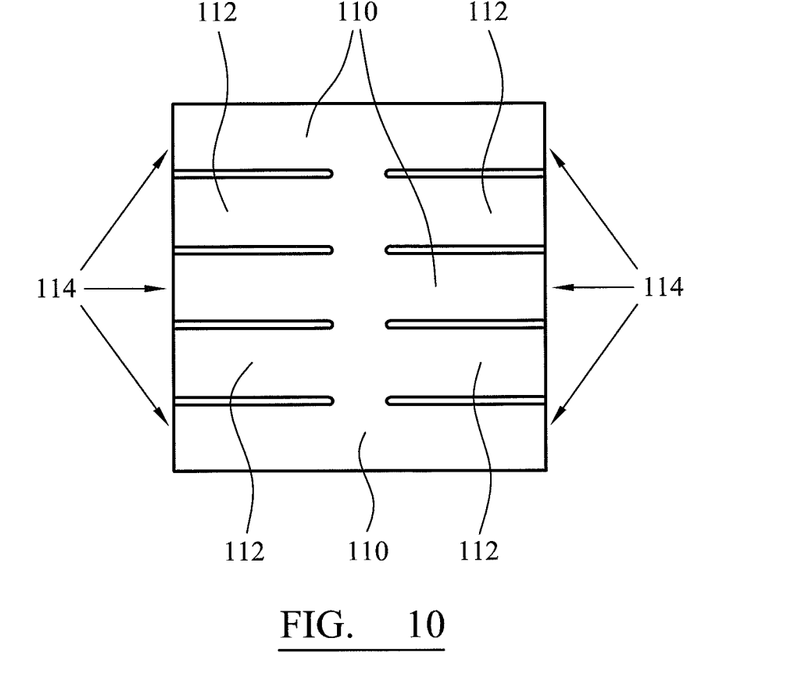
FIG. 10 is a plan view of an example of a device in accordance with the invention comprising multiple pairs of cantilever beams.

FIG. 10 illustrates a device of the type shown in FIGS. 3a and 3b but with three clamped-clamped first members 110 and two pairs of cantilever beams 112. The first members are fixed to the frame (not shown) at anchor points 114. This arrangement provides for a more even distribution of strain across the device. The increased number of individual resonators may also broaden the range of frequencies that the device responds to.

Figure 11:
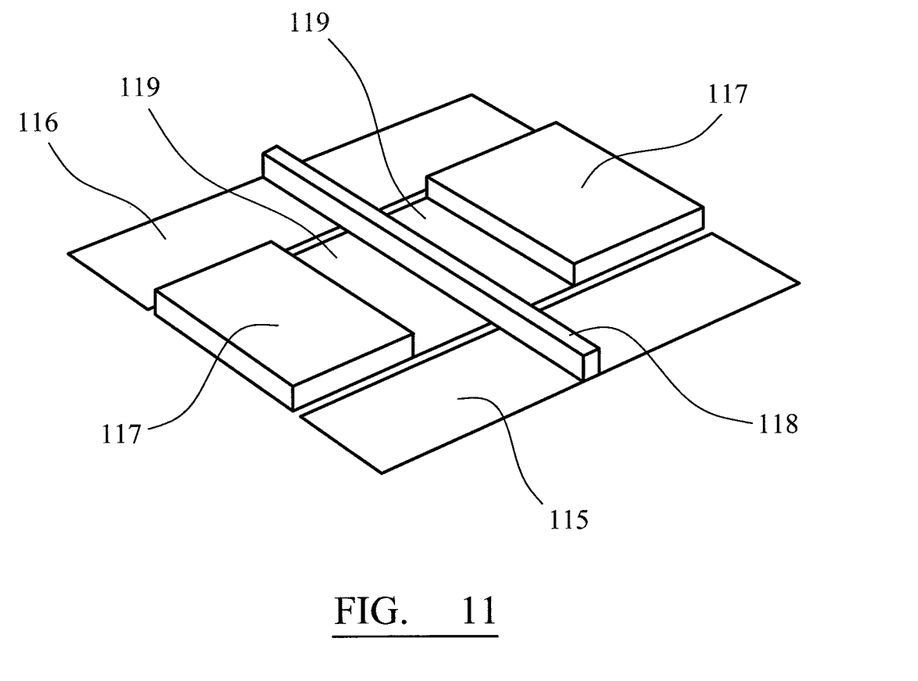
FIG. 11 is an underside perspective view of device in accordance with a further embodiment of the invention.

FIG. 11 is an underside perspective view of a further embodiment of the invention. The embodiment of FIG. 11 is similar to the embodiment of FIGS. 3a and 3b but includes a central reinforcing beam 118 that extends across the join between the first and second clamped-clamped members 115, 116 and the cantilever beams 119. The reinforcing beam may be thin relative to the length of the cantilever beams. A proof mass 117 is fixed to the free ends on the cantilever beams 119 in the same manner as in the embodiment of FIGS. 3a and 3b. By adding a reinforcing beam at the centre of the device shown in FIG. 11, the width of the areas joining the cantilever beams 119 to the first and second members 115, 116 can be made very small, giving rise to high peak strain. At the same time the reinforcing beam ensures that the structure is robust and unlikely to fail even when highly excited and provides for a more even strain distribution.

Figure 12:
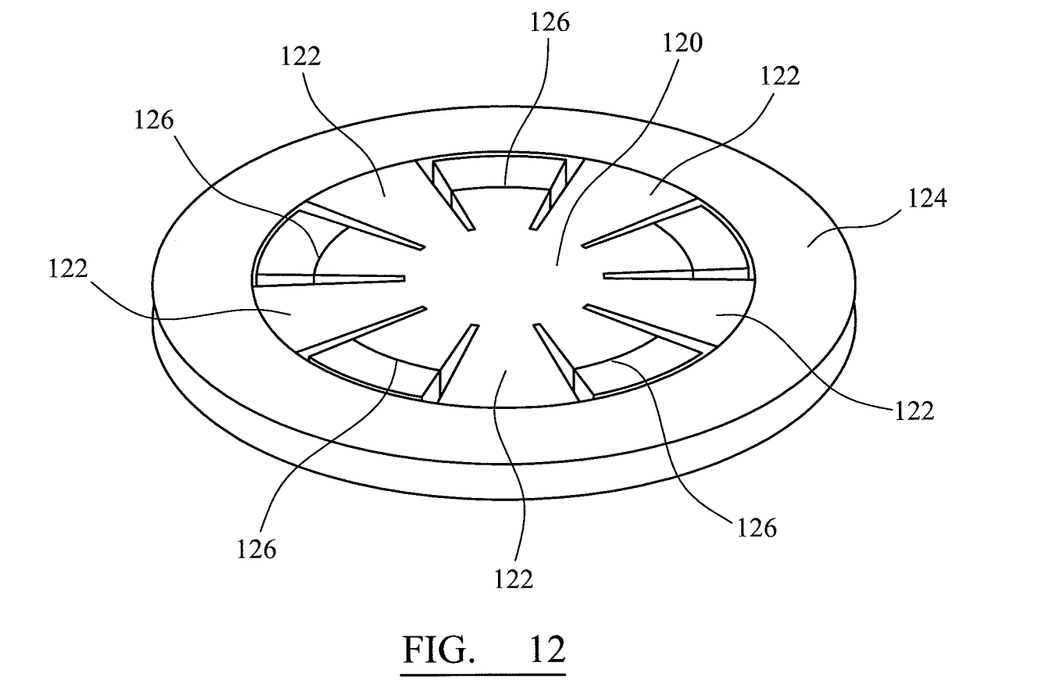
FIG. 12 is a perspective view of an example of a device in accordance with the invention having a membrane type topology.

FIG. 12 illustrates a device of the type shown in FIGS. 3a and 3b but with a membrane geometry. In the device of FIG. 12 there is a single first member 120 in the form of a central membrane that is fixed in a plurality of anchor positions 122 to the frame 124. Between the anchor positions are cantilever beams 126 extending from the central membrane. Each cantilever beams has an associated proof mass on its free end.

Figure 4:
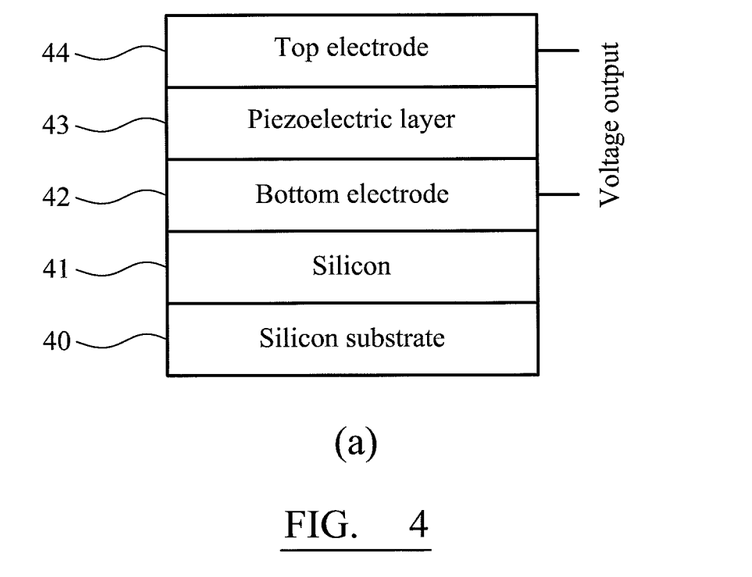
FIG. 4a is a schematic of the material layers in a device in accordance with one example of the invention.
FIG. 4b is a schematic of the material layers in a device in accordance with another example of the invention.
Figure 13:
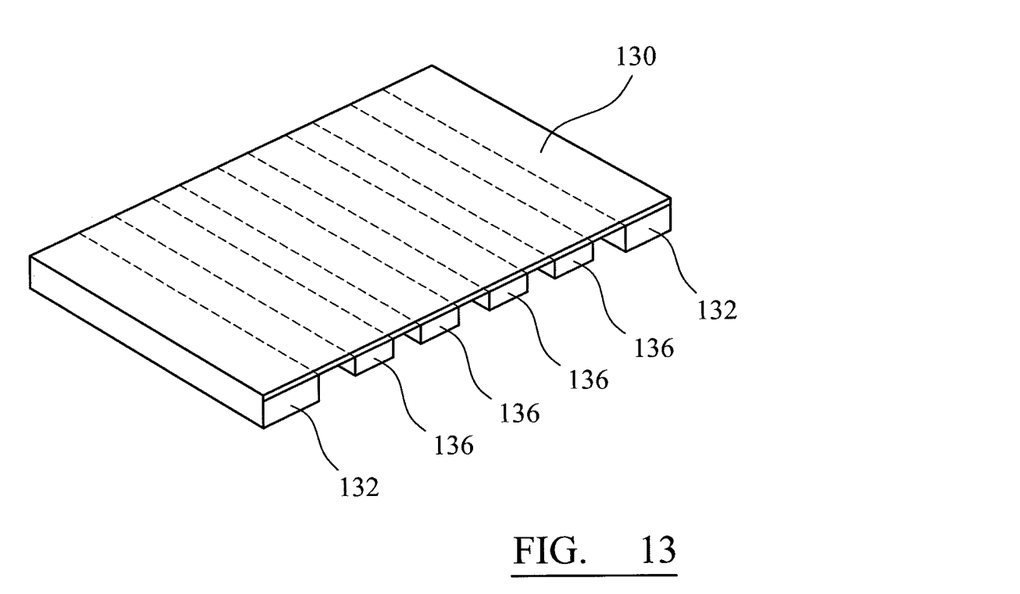
FIG. 13 is a perspective view of a device having a segmented proof mass.

FIG. 13 illustrates an alternative geometry for a device that overcomes the disadvantages of a single, centrally placed proof mass. In the device of FIG. 13, there are a plurality of proof masses 136, which may be considered as a single, segmented proof mass. The device comprises a first member 130, including a piezoelectric layer fixed at either end to a frame 132. The first member may have a layered structure as illustrated in FIG. 4a or 4b. The plurality of proof masses 136 are fixed to the first member in a spaced apart relationship to each other, allowing the first member to flex in the spaces between the proof masses. The areas of the first member between the proof masses 136 are high strain areas. Electrodes may be placed on the first member in these areas to extract energy in the same manner as described with reference to the embodiments of FIGS. 2 to 12. There is no proof mass fixed to the central region of the first member, as this is usually the area of highest strain. By providing a plurality of spaced apart proof masses, the total mass of the proof masses may be made high enough to provide a significant response to vibration, while at the same time allowing regions of high strain to be accessed. In addition the device illustrated in FIG. 13 is very robust.

Figure 14:
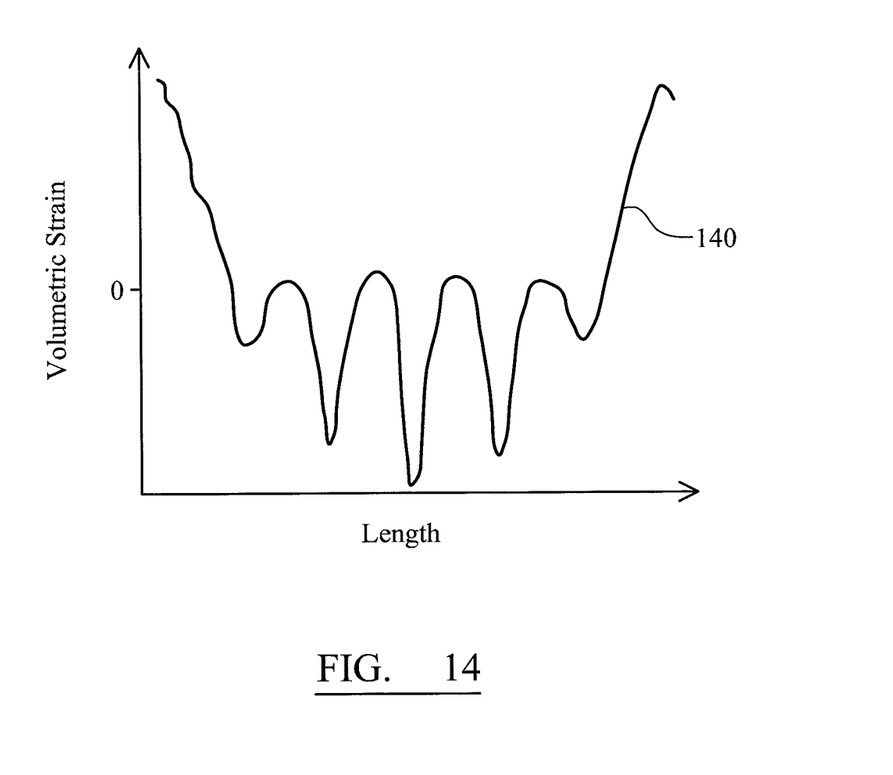
FIG. 14 is a plot of strain along the length of a device as shown in FIG. 13.

FIG. 14 is a plot of the strain along the length of the first member 130 shown in FIG. 13. It can be seen that there are regions of high strain between the proof masses and between the frame and the closest proof masses to the frame, whereas in the region of the proof masses the strain is very low.

Figure 15:
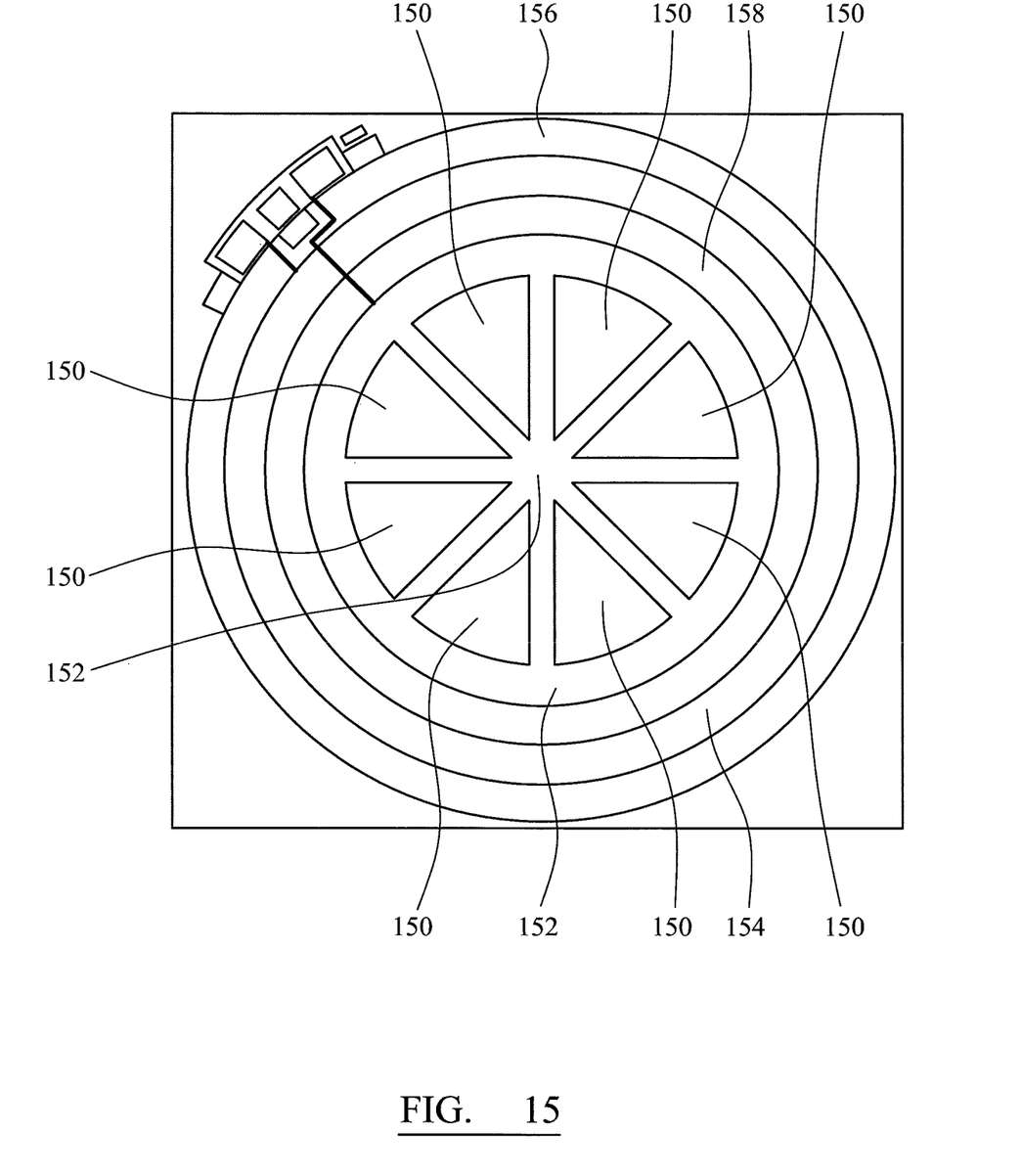
FIG. 15 is illustration of the position of electrodes on a membrane device having a segmented proof mass.

FIG. 15 is an illustration of a membrane type topology having a plurality of spaced apart proof masses. A membrane vibrator 158, including a piezoelectric layer is fixed to a frame 156. The membrane vibrator may have a layered structure as illustrated in FIG. 4a or 4b. A plurality of proof masses 150, having the shape of circular segments, are fixed to the membrane vibrator 158 in a spaced relationship, and leaving a central area of the membrane vibrator free of proof mass. A first electrode 152 is placed on the membrane vibrator around and between the proof masses 150, including over the central area. A second electrode 154 is positioned around the first electrode, close to the frame 156.

Figure 16:
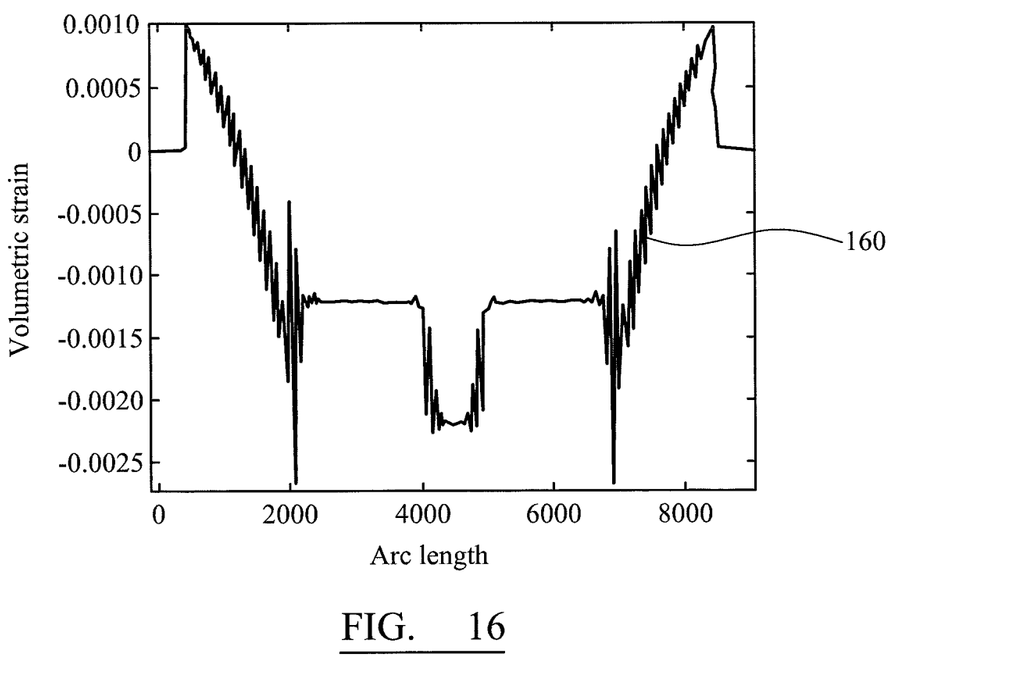
FIG. 16 is a plot of strain across of a device as shown in FIG. 15.

FIG. 16 is a plot of the strain along a line across the membrane of FIG. 15. It can be seen the second electrode is positioned to collect strain energy of one polarity while the first electrode is positioned to collect strain energy of the opposite polarity. There is little strain at the position of the proof masses, but high strain in the central area ns immediately outside of the proof masses.

The arrangement of FIG. 15 is very robust but allows for areas of high strain to be accessed. The arrangement shown in FIG. 15 can also be used as a parametric resonator. The additional flexibility provided by segmenting the proof mass allows for a desired mode shape to be achieved for a target parametric resonant regime.

The invention claimed is:

1. An energy harvesting apparatus comprising:
a frame;
a first member comprising a piezoelectric material, the first member fixed to the frame at a first position and at a second position, and extending between the first and second positions, the first member being configured to vibrate in a first direction;
a cantilever beam having a first end fixed to the first member between the first position and the second position and having a second end fixed to a proof mass, wherein the cantilever beam is coplanar with the first member and wherein the cantilever beam and the first member extend in a plane orthogonal to the first direction; and
an electrode fixed to the first member at a position between the first position and the second position.

2. An energy harvesting apparatus according to claim 1, further comprising electric circuitry connected to the electrode, the electric circuitry comprising, or connected to, an energy storage device.

3. An energy harvesting device according to claim 1, wherein the first member is a beam having one end fixed to the frame at the first position and an opposite end of the beam fixed to the frame at the second position.

4. An energy harvesting apparatus according to claim 1, wherein the first member is a membrane vibrator.

5. An energy harvesting apparatus according to claim 1, wherein the frame, first member and cantilever beam comprise a single piece of silicon.

6. An energy harvesting apparatus according to claim 1, wherein the cantilever beam extends parallel to a line extending between the first position and the second position.

7. An energy harvesting apparatus according to claim 1, wherein the cantilever beam is fixed to the first member at a position equidistant between the first position and the second position.

8. An energy harvesting apparatus according to claim 1, wherein the cantilever beam comprises a piezoelectric material.

9. An energy harvesting apparatus according to claim 8, further comprising an electrode fixed to the cantilever beam.

10. An energy harvesting apparatus according to claim 1, comprising a plurality of cantilever beams fixed to the first member between the first position and the second position, each cantilever beam fixed to or comprising a proof mass.

11. An energy harvesting apparatus according to claim 1, further comprising a plurality of electrodes fixed to the first member.

12. An energy harvesting apparatus according to claim 1, further comprising a second member comprising a piezoelectric material, the second member fixed to the frame at a third position and at a fourth position, and extending between the third and fourth positions, wherein the cantilever beam is connected to the second member between the third and fourth positions.

13. An energy harvesting apparatus according to claim 1, wherein the first member comprises a substrate layer, and wherein the piezoelectric material forms an active layer on the substrate layer.

14. An energy harvesting apparatus according to claim 13, wherein the substrate layer is formed from silicon.

15. An energy harvesting apparatus according to claim 13, wherein the piezoelectric material is aluminium nitride.

16. An energy harvesting apparatus according to claim 1, wherein a width of the first member is at least an order of magnitude greater than a thickness of the active layer.

17. An energy harvesting apparatus according to claim 1, wherein a width of the cantilever beam is at least an order of magnitude greater than a thickness of the active layer.

18. An energy harvesting apparatus according to claim 1, comprising a reinforcing beam positioned to extend between the first member and the cantilever beam at a position at which the cantilever beam is fixed to the first member.

19. An energy harvesting apparatus according to claim 18, wherein the reinforcing beam is a silicon beam.

20. An energy harvesting apparatus according to claim 18, wherein the reinforcing beam extends between a first member and second member, across one or more cantilever beams connected between the first and second members.

21. An energy harvesting apparatus according to claim 1, comprising a plurality of proof masses fixed to the cantilever beam or to the first member, wherein the plurality of proof masses are spaced apart from one another.

22. An energy harvesting apparatus according to claim 21, wherein the plurality of spaced apart proof masses are fixed to the first member, and wherein a central portion of the first member, equidistant from the first position and the second position, is not fixed to a proof mass.

23. An energy harvesting apparatus comprising:
a frame;
a first member comprising a piezoelectric material, the first member fixed to the frame at a first position and at a second position, and extending between the first and second positions;
a plurality of proof masses disposed to the first member between the first and second positions in a spaced relationship to one another such that an area of the first member extends between each pair of proof masses; and
an electrode fixed to the first member.

24. An energy harvesting apparatus according to claim 23, wherein the plurality of proof masses are in a spaced relationship to one another so that an area of the first member extends between each pair of proof masses.

25. An energy harvesting apparatus according to claim 24, wherein the electrode is positioned on an area of the first member corresponding to a space between the plurality of proof masses.

26. An energy harvesting apparatus according to claim 24, wherein a central area of the first member, equidistant from the first position and the second position, is not connected to a proof mass.

27. An energy harvesting apparatus according to claim 23, wherein the plurality of proof masses are symmetrically disposed on the first member.

28. An energy harvesting apparatus according to claim 23, wherein the first member is a membrane vibrator.

29. An energy harvesting apparatus according to claim 22, wherein the first member comprises a substrate layer, and wherein the piezoelectric material forms an active layer on the substrate layer.

30. An energy harvesting apparatus according to claim 29, wherein the substrate layer is formed from silicon.

31. An energy harvesting apparatus according to claim 29, wherein the piezoelectric material is aluminium nitride.

32. An energy harvesting apparatus according to claim 29, wherein a width of the first member is at least an order of magnitude greater than a thickness of the active layer.

* * * * *